(12) United States Patent
Tuominen

(10) Patent No.: US 10,595,414 B2
(45) Date of Patent: Mar. 17, 2020

(54) COMPONENT CARRIER AND MANUFACTURING METHOD

(71) Applicant: AT&S (China) Co. Ltd., Shanghai (CN)

(72) Inventor: Mikael Tuominen, Shanghai (CN)

(73) Assignee: AT&S (China) Co. Ltd., Shanghai (CN)

( * ) Notice: Subject to any disclaimer, the term of this patent is extended or adjusted under 35 U.S.C. 154(b) by 0 days.

(21) Appl. No.: 15/942,548

(22) Filed: Apr. 1, 2018

(65) Prior Publication Data

US 2018/0288879 A1 Oct. 4, 2018

(30) Foreign Application Priority Data

Apr. 1, 2017 (CN) ...................... 2017 2 0344897 U

(51) Int. Cl.
*H05K 1/18* (2006.01)
*H01L 23/538* (2006.01)
(Continued)

(52) U.S. Cl.
CPC .......... *H05K 1/186* (2013.01); *H01L 21/4857* (2013.01); *H01L 23/5383* (2013.01); *H01L 23/5384* (2013.01); *H01L 23/5389* (2013.01); *H05K 1/0271* (2013.01); *H05K 1/115* (2013.01); *H05K 3/0044* (2013.01); *H05K 3/301* (2013.01);
(Continued)

(58) Field of Classification Search
CPC ...... H05K 1/182–1/186; H05K 1/0271; H05K 1/115; H05K 3/0044; H05K 3/301; H05K 3/4644; H05K 3/4697; H01L 21/4857; H01L 23/5383; H01L 23/5384; H01L 23/5389
See application file for complete search history.

(56) References Cited

U.S. PATENT DOCUMENTS

2008/0041619 A1\* 2/2008 Lee .......................... H01L 24/24
174/260
2011/0141711 A1\* 6/2011 Sohn .................... H01L 23/5389
361/760
(Continued)

FOREIGN PATENT DOCUMENTS

JP 2005142178 A 6/2005

*Primary Examiner* — Steven T Sawyer
(74) *Attorney, Agent, or Firm* — Robert A. Blaha; Smith Tempel Blaha LLC

(57) ABSTRACT

A component carrier includes a first level stack of first plural of electrically conductive layer structures and/or first electrically insulating layer structures; a first component aligned within a first through hole cut out in the first level stack such that one of an upper or a lower surface of the first component is substantially flush with an respective upper or a lower surface of the first level stack second electrically conductive layer structures and/or second electrically insulating layer structures attached onto the upper and the lower surface of the first level stack thereby covering the first component at the upper and the lower surface of the first component and pressed to form a second level stack. A second component is aligned within a second through hole cut out in the second level stack such that one of upper or a lower surface of the second component is substantially flush with an upper or a lower surface of the second level stack.

16 Claims, 3 Drawing Sheets

(51) Int. Cl.
*H01L 21/48* (2006.01)
*H05K 3/30* (2006.01)
*H05K 1/02* (2006.01)
*H05K 3/00* (2006.01)
*H05K 3/46* (2006.01)
*H05K 1/11* (2006.01)

(52) U.S. Cl.
CPC .. *H05K 3/4697* (2013.01); *H01L 2224/04105* (2013.01); *H01L 2224/06181* (2013.01); *H01L 2224/2518* (2013.01); *H05K 3/4644* (2013.01); *H05K 2201/09136* (2013.01); *H05K 2201/09636* (2013.01); *H05K 2201/10712* (2013.01); *H05K 2201/10727* (2013.01); *H05K 2203/0147* (2013.01); *H05K 2203/0228* (2013.01); *H05K 2203/1311* (2013.01); *H05K 2203/166* (2013.01)

(56) References Cited

U.S. PATENT DOCUMENTS

| | | | |
|---|---|---|---|
| 2012/0075818 A1* | 3/2012 | Lee | H01L 24/24 361/761 |
| 2013/0192884 A1* | 8/2013 | Furutani | H05K 1/185 174/258 |
| 2014/0131084 A1 | 5/2014 | Lee et al. | |
| 2016/0309575 A1* | 10/2016 | Min | H05K 1/0206 |
| 2016/0316566 A1* | 10/2016 | Sakai | H05K 1/185 |
| 2019/0037701 A1* | 1/2019 | Bao | H05K 1/115 |

* cited by examiner

COMPONENT CARRIER AND MANUFACTURING METHOD

CROSS-REFERENCE TO RELATED APPLICATION

This application claims the benefit of the filing date of China Utility Model Application No. ZL 201720344897.9 filed 1 Apr. 2017, the disclosure of which is hereby incorporated by reference.

TECHNICAL FIELD

The present invention relates to a component carrier having embedded therein at least two components. Further, the present invention relates to a method for manufacturing a component carrier having at least two components embedded therein.

TECHNOLOGICAL BACKGROUND

US 2016/316566 A1 discloses a wiring board with built-in electronic component and method for manufacturing the same, wherein a multi-layer core substrate includes insulating layers and conductive layers such that the insulating layers include a central insulating layer in the center position of the core in the thickness direction, a first built-up layer including an insulating layer and a conductive layer such that the insulating layer has resin composition different from that of the insulating layers in the core, and a second built-up layer including an insulating layer and a conductive layer such that the insulating layer has resin composition different from that of the insulating layers in the core. The core has cavities accommodating the electronic components, respectively, and including a first cavity and a second cavity such that the first and the second cavity have different lengths in the thickness direction and are penetrating through the central layer at the center of the first and second cavities in the thickness direction.

US 2014/131084 A1 discloses a capacitor embedded substrate that can implement low impedance over a wide frequency band and improve heat radiation performance and signal transmission performance at the same time by embedding a plurality of capacitors having different capacitances in a laminated core and connecting the capacitors in parallel.

JP 2005-142178 A discloses a multi-layer printed wiring board with built-in electronic component, wherein a first wiring board with the electronic components mounted and a second wiring board with the electronic components mounted are laminated with the sides of the mounted components in face to face which each other wire via in interlayer insulating layer, thereby providing the built-in multi-layer printed wiring board with the components.

In the prior art it has been observed that including components in a multi-layer structure, such as a printed circuit board (PCB) packet has some shortcoming and problems. In particular, a combination of components having different thicknesses in the same embedded PCB package may often be challenged by an unsymmetrical or unbalanced embedded core structure. Main problems may be related to resin filling or may be related to warping performance of the core package. Further, in the conventional systems and methods, providing the appropriate connectivity of the included components with other circuitry within the printed circuit board may not in all situations be easily achieved.

Thus, there may be a need for a component carrier and a manufacturing method for manufacturing the component carrier which allows to reliably and efficiently embed components, such as electric and/or electronic components into a multi-layer structure in particular by applying a simple manufacturing method which is reliable and allows a flexibility for achieving the required electric connectivities of the embedded components. Further, the manufactured component carrier is desired to exhibit reduced warping performance.

SUMMARY

This need may be solved by the subject-matter of the independent claims. The dependent claims specify particular embodiments of the present invention.

According to an embodiment of the present invention it is provided a component carrier, comprising: a first level stack of (in particular fully cured, solidified) first plural electrically conductive layer structures and/or first electrically insulating layer structures; a first component aligned within a first through hole cut out in the first level stack such that one of an upper or a lower surface of the first component substantially is flush with an respective upper or a lower surface of the first level stack; second electrically conductive layer structures and/or second electrically insulating layer structures attached onto the upper and the lower surface of the first level stack thereby covering the first component at the upper and the lower surface of the first component and pressed to form a second level stack; a second component aligned within a second through hole cut out in the second level stack such that one of upper or a lower surface of the second component substantially is flush with an upper or a lower surface of the second level stack.

OVERVIEW OF EMBODIMENTS

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force, if desired accompanied by heat.

The first level stack comprised of (stacked) first plural electrically conductive layer structures and/or first electrically insulating layer structures may be fully cured, for example polymerized and solidified. In particular, the upper surface of the first level stack and the lower surface of the first level stack may be covered by a layer of (patterned) copper. The conductive layer structures may comprise copper layer(s) and the first insulating layer structures may comprise polymerized resin, in particular mixed with fibers. The first electrically insulating layer structures may be substantially made of a same or similar material as the second electrically insulating layer structures and may be shaped in a similar or same manner. Further, also the first electrically conductive layer structures may be similar or same as the second plural electrically conductive layer structures. To form the first level stack, pressure and/or heat may have been applied to the first plural electrically conductive layer structures and/or first electrically insulating layer structures in a direction perpendicular to a main surface of the layer structures.

The first level stack may have been formed prior to forming the second level stack that contains in fact the first level stack (in particular at the center). In particular, the second electrically conductive layer structures and/or second electrically insulating layer structures may sandwich in between the first level stack. In particular, a same or similar number of second electrically conductive layer structures and/or second electrically insulating layer structures may be attached on each side, i.e. the upper side and the lower side of the first level stack. Thus, within the second level stack, the first level stack may form a central core.

The first through hole may have a cross-sectional size which is larger than the cross-sectional size of the first component. The first component may be laterally and/or vertically aligned within the first through hole. In particular, vertically aligning the first component such that the upper surface or the lower surface of the first component substantially is flush with a respective upper or lower surface of the first level stack may advantageously and appropriately enable in particular electrically contacting terminals of the first component with other circuitry required for driving or in general operating the first component. The first and/or also the second component may be any electric or electronic component usually used for building a circuit or an electric circuit. For aligning the first component (and/or the second component), one or more auxiliary structures may be utilized and which may support the first component and/or second component in a manufacturing method step. The second electrically conductive layer structures and/or second electrically insulating layer structures may completely cover and thereby enclose the first component and the upper and the lower surface of the first component. In any free spaces surrounding the first component and being within the first through hole, filling material may be applied, such as resin and fibers.

When a surface of the first component substantially is flush with a respective upper or a lower surface of the first level stack, it may mean that the surface of the first component substantially is at a same vertical position as the respective upper or a lower surface of the first level stack.

In general, the specification that a first surface substantially is flush with a second surface may mean that the first surface substantially is at a same vertical position as the second surface, thus the first surface is vertically aligned with the second surface.

The second component may have a different thickness (in particular larger thickness) than the first component or may have substantially a same thickness. The lateral extent of the first component may be similar or different from the lateral extent of the second component. The component carrier may be manufactured by implementing a stepwise symmetrical method. Thereby, the core of the printed circuit board may be balanced. In particular, by using several embedding steps, the unbalanced core structure may be avoided and the resulting warping issues, resin filling issues and other negative effects may be avoided.

Embodiments of the present invention provide a product and a related process of producing the product, wherein the components having different thicknesses (in particular first embedding the smaller thickness components then embedding, when the stack becomes thicker and thicker, the larger thickness components in an ordered manner) are embedded into the core in a stepwise manner. The symmetrical stepwise method may include to sandwich a previously manufactured stack of a previous level by applying (symmetrically) on the respective upper surface and the lower surface of the previous level stack a (in particular same number of) further electrically conductive layer structures and/or second electrically insulating layer structures such that the previous level stack is at a center of the thereby formed next level stack. The z-direction orientation of the component and/or the vertical position of the component may be varied between the different embedding steps which may result in an additional flexibility for the electrical routing of the overall package.

For example, in a first embedding step, the (at least two or more than two) components may be laterally aligned on either the top or bottom of the (previous level stack) or PCB and the further electrical connection may be established either one- or two-sided from the component location.

In a second embedding step, further components may be laterally aligned on either the top or the bottom of the (previous level stack) or in general the PCB and further electrical connections may be established either first- or second-sided from this location.

In a third embedding step, even further components may be laterally aligned on either the top or the bottom of the PCB and further electrical connections may be established either one-sided or two-sided from this location. This stepwise process may be repeated as many times as required.

According to an embodiment of the present invention, the lower surface of the first component is substantially flush with the lower surface of the first level stack, wherein the upper surface of the second component is substantially flush with the upper surface of the second level stack, and/or wherein a thickness of the second electrically conductive layer structures and/or second electrically insulating layer structures attached at the upper surface of the first level stack is essentially the same as a thickness of the second electrically conductive layer structures and/or second electrically insulating layer structures attached at the lower surface of the first level stack. Thus, the lower surface of the first component is essentially at a same vertical position (along a thickness direction) as the lower surface of the first level stack and the upper surface of the second component is substantially at a same vertical position as the upper surface of the second level stack.

Thereby, the first component advantageously may easily be connected to other circuitries at a lower portion of the completed component carrier and the second component may electrically be easily connected to further circuitry located above the upper surface of the second level stack. In other embodiments, the first component and also the second component may be connectable by the proper alignment towards either an upper surface or a lower surface of the respective level stack, for contacting to other circuitry both above or both below the first component and the second component. Thereby, a great flexibility for the connectivity may be achieved.

According to an embodiment of the present invention, the second electrically conductive layer structures and/or second electrically insulating layer structures comprises at least one first through hole via electrically connected to a terminal of the first component. The first through hole via may provide an electric connectivity in the vertical direction for appropriately connecting the first component to other circuitries for operating the first component. In particular, the first component may comprise a plurality of terminals and a plurality of first through hole vias may be provided at different lateral positions in correspondence to the plural terminals of the first component. Thereby, providing a required electrical connectivity is enabled.

According to an embodiment of the present invention, the component carrier further comprises third electrically conductive layer structures and/or third electrically insulating layer structures attached onto the upper and the lower surface of the second level stack thereby covering the second component at the upper and the lower surface of the second component and pressed to form a third level stack. The third electrically conductive layer structures and/or third electrically insulating layer structures may sandwich (in particular in a symmetrical manner) the second level core, such that in the third level stack, the second level stack is arranged in a vertical center region.

In particular, disregarding the embedded components and through hole vias, the resulting third level stack (as also the previously manufactured second level stack) may have substantially mirror symmetry with respect to a mirror plane arranged vertically in the center of the third level stack. Thereby, the manufacturing may be simplified.

The third electrically conductive layer structures and/or third electrically insulating layer structures may be similar or made of same material as the first or second electrically conductive layer structures and/or first or second electrically insulating layer structures. Thereby, manufacturing may still be simplified.

In particular, the first through hole via may be arranged in a lower layer of the second electrically conductive layer structures and/or second electrically insulating layer structures, i.e. those which are attached at the lower surface of the first level stack. In contrast, the second through hole via may be provided in the third electrically conductive layer structures and/or third electrically insulating layer structures which are attached on the upper surface of the second level stack. Thereby, electrical connectivity of the first component towards circuitry below the first component and connectivity of the second component to circuitry arranged above the second component may be enabled.

According to an embodiment of the present invention, the third electrically conductive layer structures and/or third electrically insulating layer structures comprises at least one second through hole via electrically connected to a terminal of the second component.

According to an embodiment of the present invention, the first through hole via contacts a terminal of the first component at the lower surface of the first component, wherein the second through hole via contacts a terminal of the second component at the upper surface of the second component. In another embodiment, the first through hole may contact a terminal of the first component at the upper surface of the first component. In another embodiment, the second through hole via may contact a terminal of the second component and the lower surface of the second component. Thereby, a large flexibility regarding electrical connectivity may be enabled.

According to an embodiment of the present invention, the third electrically conductive layer structures and/or third electrically insulating layer structures comprises at least one first extension through hole via electrically connected to the first through hole via in the second electrically conductive layer structures and/or second electrically insulating layer structures. The at least one first extension through hole via may be required to extend an electrical connection between the first component and other circuitries using the first through hole via together with the first extension through hole via.

The first and/or second through hole via and also the first extension through hole via may be made by cutting a through hole into the respective layer structure and then plating the through hole with electrically conductive material or filling the through hole completely with electrically conductive material. Other methods may be possible.

Placing the first component and the second component in respective cut-out through holes such that the first component and/or the second component does not protrude from the previously solidified and fully cured and polymerized previous level stack may protect the component from damage when, after applying and attaching the additional electrically conductive layer structures and/or electrically insulating layer structures at the upper surface and the lower surface of the previous level stack, the pressure and/or heat is applied for also curing and polymerizing the further applied layer structures.

According to embodiments of the present invention, also predefined vertical margins between upper and lower surfaces of the component on one hand and upper and lower surface vertical position of the previous level stack may be complied with for effectively protecting the component during the manufacturing.

According to an embodiment of the present invention, a thickness of the first component is between a thickness of the first level stack diminished by 100 µm, in particular 50 µm, and the thickness of the first level stack diminished by 5 µm, in particular 20 µm, wherein the thickness of the first component and/or the second component is between 30 µm and 100 µm, in particular between 50 µm and 60 µm, wherein the thickness of the second component is between 1.5 times and 3 times as great as the thickness of the first component.

The inventor found that to provide this margin effectively protects the component during the embedding and in general manufacturing of the component carrier. Thus, in particular, a vertical distance between the upper surface of the first component and the upper surface of the first level stack may be between 100 µm and 5 µm to provide an appropriate margin. When the thickness of the component is between 30 µm and 100 µm conventionally available electric and/or electronic components may be supported by the embedding method and may thus be comprised within the component carrier.

According to embodiments of the present invention, the thickness of the first component is smaller than the thickness of the second component. In particular, the plural components to be embedded into the finalized component carrier may first be put in an order depending on their thickness (i.e. vertical extension). In a first manufacturing step, the components having the smallest thickness may be embedded into the first level stack. Then, the components having a larger thickness than the components embedded into the first level stack may be embedded into the second level stack. This process may go on until the components having the largest thickness may be embedded into the last level stack comprising all the previous level stacks including the components having smaller sizes than the components only embedded in the last level stack. From one step to another step, the vertical extension of the component carrier may increase in a stepwise manner having in particular a same increment. Thereby, the method may be simplified.

According to an embodiment of the present invention, a space within the first through hole not occupied by first component is filled by thermosettable material and cured. Thereby, the components may further be stabilized within the component carrier. Further, heat may be conducted away from the components more efficiently which may improve the operation of the components and may protect the component from damage in particular prevent it from overheating.

According to an embodiment of the present invention, the first component and/or the second component comprises at least one of: a resistor; a capacitor; an integrated circuit; an inductor. Thus, conventionally available component types may be comprised in the component carrier.

As is understood by the skilled person, in the first level stack, a plurality of first components may be embedded and/or within the second level stack and/or third level stack and any other stack, a plurality of other components may be embedded. The symmetrical and stepwise manufacturing method may reach a high stability and may enable a low warping component carrier. The component carrier may comprise thin dies and different components having different or similar or same thicknesses. In particular, passive components may conventionally be thicker than 200 µm and many of the conventionally available dies (integrated circuits) may be smaller than 100 µm in thickness. Combining those different kinds of components having different thicknesses in the same embedded package with one time process may conventionally be impossible or may result in heavily unbalanced products.

The embedded of the different components having different thicknesses may be performed in a sequential manner.

The component carrier may further comprise a component, in particular an electronic component, mounted on and/or embedded in the at least one electrically insulating layer structure and/or the at least one electrically conductive layer structure.

The component may be selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

The at least one electrically conductive layer structure may comprise at least one of the group consisting of copper, aluminum, nickel, silver, gold, palladium, and tungsten, any of the mentioned materials being optionally coated with supra-conductive material such as graphene.

The at least one electrically insulating layer structure may comprise at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

The component carrier may be shaped as a plate.

The component carrier may be configured as one of the group consisting of a printed circuit board, and a substrate.

The component carrier may be configured as a laminate-type component carrier.

Embodiments of the present invention provide also a method for manufacturing a component carrier. Features disclosed with respect to the component carrier also apply in any combination to the manufacturing method and vice versa.

The following numbered embodiments are also provided by the present invention.

Embodiment 1

Method for manufacturing a component carrier, comprising:
cutting out a first through hole in a first level stack of (fully cured) first plural of electrically conductive layer structures and/or first electrically insulating layer structures;
aligning a first component within the first through hole such that one of an upper or a lower surface of the first component is substantially flush with an respective upper or a lower surface of the first level stack;
attaching second electrically conductive layer structures and/or second electrically insulating layer structures onto the upper and the lower surface of the first level stack thereby covering the first component at the upper and the lower surface of the first component;
applying heat and/or pressure to the second electrically conductive layer structures and/or electrically insulating layer structures to form a second level stack;
cutting out a second through hole in the second level stack;
aligning a second component within the second through hole such that one of upper or a lower surface of the second component is substantially flush with an upper or a lower surface of the second level stack.

Embodiment 2

Method according to embodiment 1, further comprising:
attaching third electrically conductive layer structures and/or third electrically insulating layer structures onto the upper and the lower surface of the second level stack thereby covering the second component at the upper and the lower surface of the second component;
applying heat and/or pressure to the third electrically conductive layer structures and/or electrically insulating layer structures to form a third level stack.

Embodiment 3

Method according to embodiment 1 or 2, wherein a thickness of the first component is between a thickness of the first level stack diminished by 100 µm, in particular 50 µm, and the thickness of the first level stack diminished by 5 µm, in particular 20 µm,
wherein the thickness of the first component and/or the second component is between 30 µm and 100 µm, in particular between 50 µm and 60 µm,
wherein the thickness of the second component is between 1.5 times and 3 times as great as the thickness of the first component.

Embodiment 4

Method according to one of embodiments 1 to 3, wherein aligning the first component comprises:
applying a first auxiliary adhesive layer at a surface of the first level stack such as to cover the first through hole from one side;
adhering the first component at the first auxiliary adhesive layer.

Embodiment 5

Method according to one of embodiments 1 to 4, wherein aligning the first component comprises:

laterally attaching the first component at the first level stack.

Embodiment 6

Method according to one of embodiments 1 to 5, further comprising filling space within first through hole not occupied by first component by thermosettable material.

Embodiments of the present invention are now described with reference to the accompanying drawings. The invention is not restricted to illustrated or described embodiments.

DETAILED DESCRIPTION OF EXEMPLARY EMBODIMENTS

Figure 1A:
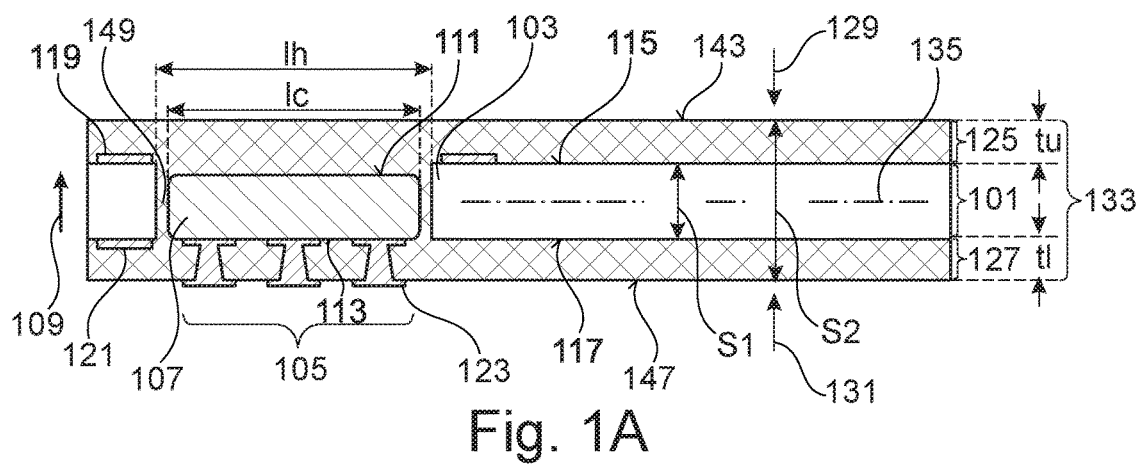
FIG. 1A illustrates a method step of a method for manufacturing a component carrier according to an embodiment of the present invention.
Figure 1B:
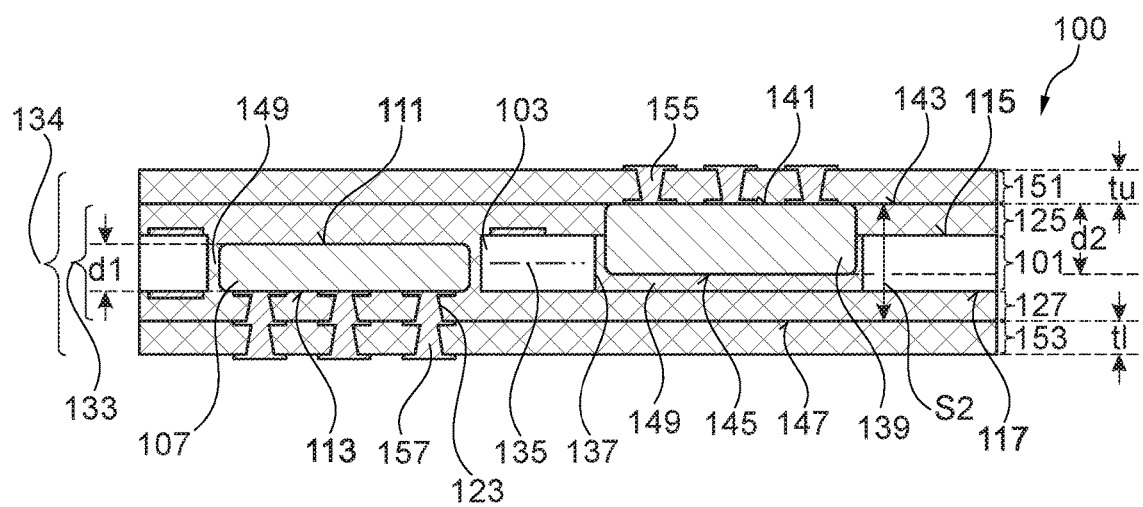
FIG. 1B schematically illustrates a further step of manufacturing a component carrier according to an embodiment of the present invention and thereby also illustrating a component carrier according to an embodiment of the present invention.

FIG. 1B schematically illustrates in a cross-sectional side view a component carrier 100 according to an embodiment of the present invention which is manufactured using a method of manufacturing a component carrier according to an embodiment of the present invention. FIG. 1A thereby illustrates a first embedding step during the manufacturing step. A first level stack 101 comprises first plural electrically conductive layer structures and/or first electrically insulating layer structures which are fully cured, polymerized and solidified. A first through hole 103 is cut out from the first level stack 101 in a particular lateral region 105 such that the lateral extent lh of the region 105 of the first through hole 103 is larger than a lateral extent lc of a first component 107. After cutting out the through hole 103, the first component 107 is placed within the first through hole 103 and is aligned in the vertical direction 109 such that an upper surface 111 or a lower surface 113 of the first component 107 is substantially flush with a respective upper surface 115 or a lower surface 117 of the first level stack 101. Thereby, according to an exemplary embodiment, the upper surface 115 and/or the lower surface 117 of the first level stack 101 may be defined as a surface of a (patterned) copper layer essentially sandwiching the first level stack 101. Such copper layers 119 and 121 at the upper surface 115 and the lower surface 117, respectively of the first level stack 101 are indicated in FIG. 1A.

Then second electrically conductive layer structures and/or second electrically insulating layer structures 125, 127, are being attached at the upper surface 115 and the lower surface 117 of the first level stack 101. Thereby, the thickness to of the second layer structures 125 at the upper surface 115, is substantially the same as the thickness tl of the second layer structures 127 attached at the lower surface 117 of the first level stack 101.

Furthermore, at least one first through hole via 123 is formed (e.g. by drilling or laser cutting) in the second electrically conductive layer structures and/or second electrically insulating layer structures 125, 127, attached at the upper surface 115 and the lower surface 117 of the first level stack 101, respectively.

Before forming the at least one first through hole via 123, pressure along the arrows 129, 131 may have been applied to the second layer structures 125, 127 and heat may have been applied, in order to completely cure and polymerize and thus solidify the second layer structures 125, 127. By sandwiching the first level stack 101 using the second layer structures 125, 127, a second level stack 133 is formed. Disregarding the embedded first component 107 and the vias 123, the intermediate product as is schematically illustrated in FIG. 1A has substantially a mirror symmetry with respect to a mirror plane 135 in the vertical center of the second layer stack 133.

In the next manufacturing step as illustrated in FIG. 1B in a sectional side view, a second through hole 137 is cut out in or from the second level stack 133. A second component 139 having a thickness d2 being larger than the thickness d1 of the first component 107 is placed within the second through hole 137 and is vertically aligned such that the upper surface 141 of the second component 139 is substantially flush with the upper surface 143 of the second level stack 133. The second component 139 has a lower surface 145 that does not flush with the lower surface 147 of the second level stack 133. In the remaining space within the first through hole 103 not occupied by the first component 107, resin or any other filling material 149 is filled. This filling material is also provided in the remaining space within the second through hole 137 not occupied by the second component 139.

After placing and aligning the second component 139, third electrically conductive layer structures and/or third electrically insulating layer structures 151, 153 are attached at the upper surface 143 and the lower surface 147 of the second level stack 133, respectively, in particular symmetrically. In particular, the thickness tu of the third layer structures 151 attached at the upper surface 143 of the second level stack 133 are essentially the same as the thickness tl of the third layer structures 153 attached at the lower surface 147 of the second level stack 133. In particular, the thicknesses of the third layer structures 151, 153 are also, according to the illustrated embodiment, same or similar as the thicknesses of the second layer structures 125, 127 attached at an upper side and a lower side of the first level stack 101. The third layer structures 151, 153 attached to the second level stack 133 form the third level stack 134.

Furthermore, the third layer structures 151 attached at the upper surface 143 of the second level stack 133 comprise at least one second through hole via 155 which connects to a terminal of the second component 139. Furthermore, in the third layer structures 153 attached at the lower surface 147 of the second level stack 133, at least one first extension through hole via 157 is provided which is electrically connected to the first through hole via 123 in the second electrically conductive layer structures and/or second electrically insulating layer structures 127 attached at the lower surface 117 of the first level stack 101.

The thickness d1 of the first component 107 is smaller than the thickness s1 (including the copper layers 119, 121) of the first level stack 101 by an amount between 5 µm and 100 µm. Further, the thickness d2 of the second component 129 is smaller than the thickness s2 of the second level stack 133 by an amount also between 5 µm and 100 µm. Furthermore, the thickness d2 of the second component 139 is, in the illustrated embodiment about 1.5 times the thickness d1 of the first component 107. The first level stack may include the copper layers 119, 121.

Figure 2A:
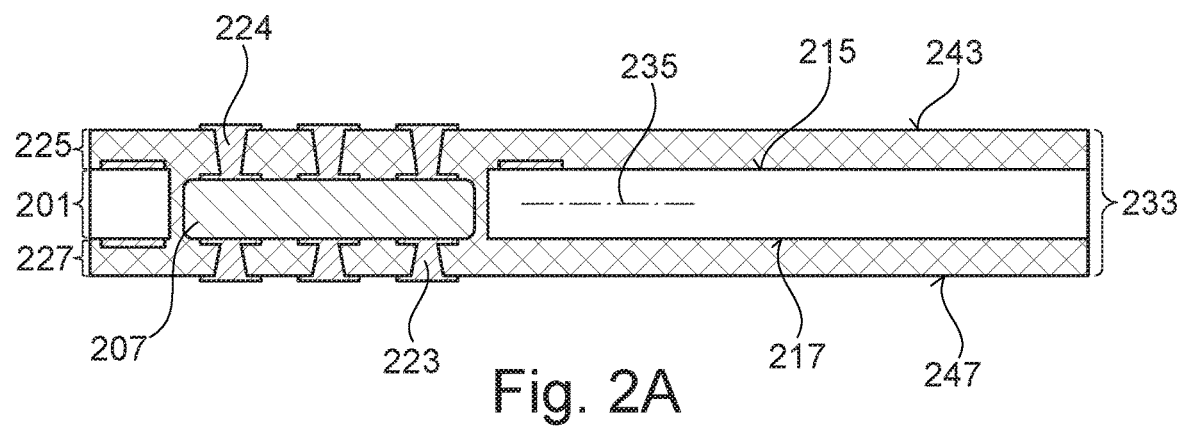
FIG. 2A illustrates a method step of a method for manufacturing a component carrier according to an embodiment of the present invention.
Figure 2B:
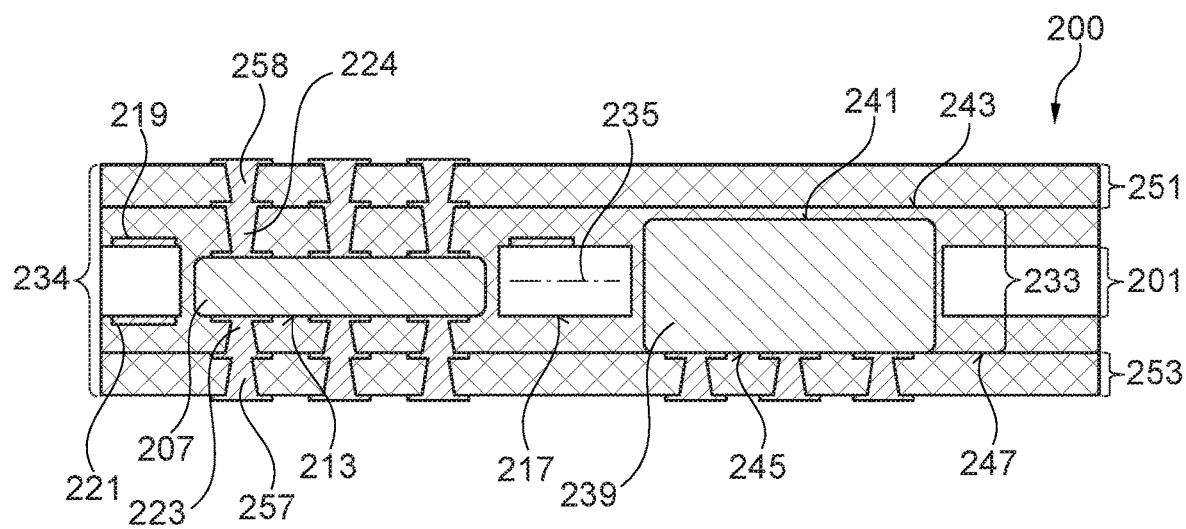
FIG. 2B schematically illustrates a further step of manufacturing a component carrier according to an embodiment of the present invention and thereby also illustrating a component carrier according to an embodiment of the present invention.

FIG. 2B schematically illustrates a component carrier 200 according to another embodiment of the present invention in a sectional side view. Structures and/or elements similar in structure and/or function are labelled in the different figures with reference signs differing only in the first digit. The component carrier 200 has several similarities with the component carrier 100 illustrated in FIG. 1B. Different from the component carrier 100 illustrated in FIG. 1B, the component carrier 200 illustrated in FIG. 2B has a high connectivity of the first component 207 to not illustrated circuitry below and above the first component 207. Herein, although the first component 207 is aligned such that the lower surface 213 of the first component 207 is substantially flush with the lower surface 217 of the first level stack 201, there is not only first through hole vias 223 in the second layer structures 227 attached to the lower surface 217 of the first level stack 201. Additionally, there are first through hole vias 224 in the second layer structures 225 attached to the upper surface 215 of the first level stack 201 and first extension through hole vias 258 in the third layer structures 251 attached to the upper surface 243 of the second level stack 233. Thereby, it is enabled to electrically contact terminals of the first component 207 also to circuitry being arranged above the first component 207. The first component 207 is aligned such that the lower surface 213 of the first component 207 is at a same vertical position as the lower surface 217 of the first level stack 201 (excluding the copper layers 219, 221). The second component 239 is aligned, such that its lower surface 245 is substantially at a same vertical position as the lower surface 247 of the second layer stack 233.

Figure 3:
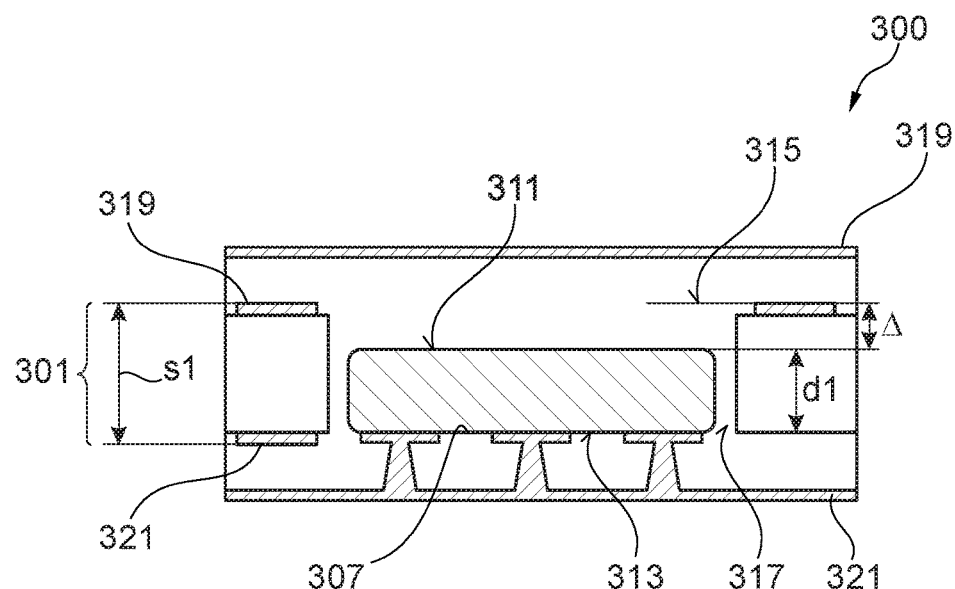
FIG. 3 schematically illustrates a side view of a portion of a component carrier according to an embodiment of the present invention.

FIG. 3 schematically illustrates a portion of a component carrier 300 according to an embodiment of the present invention which illustration may apply to both the component carriers 100 and 200 illustrated in FIGS. 1B and 2B, respectively. The first level stack 301 including the copper layers 319, 321 attached at an upper side and a lower side has a thickness s1 which may range between 50 and 500 µm. The first level stack as illustrated in FIGS. 1 and 2 may be considered to also comprise the copper layers on a top and a bottom. The thickness d1 of the component, for example first component 307, is by an amount Δ smaller than the thickness s1 of the first level stack 301 (including the copper layers 319, 321). The amount or Δ may range between 5 µm and 100 µm, for example, other values are possible.

Figure 4A:
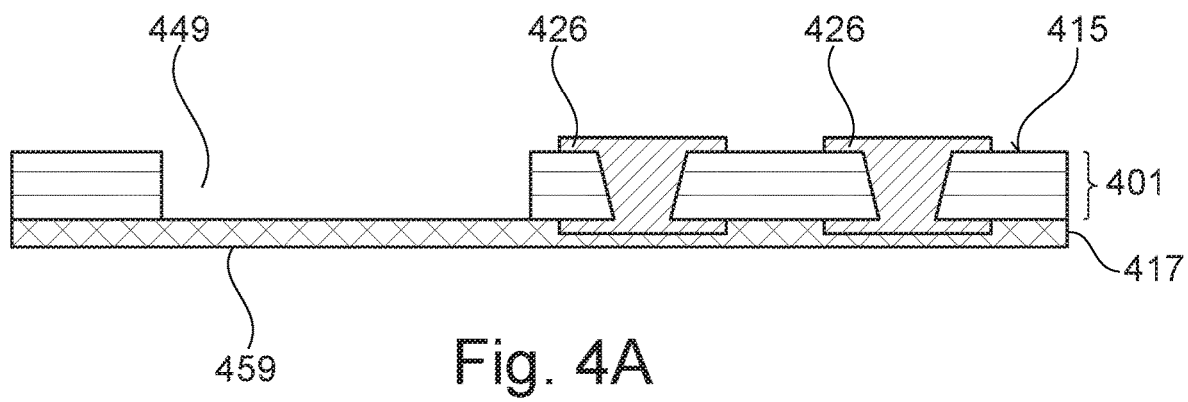
FIGS. 4A, 4B and 4C schematically illustrate examples of method steps during a manufacturing method according to an embodiment of the present invention.
Figure 4B:
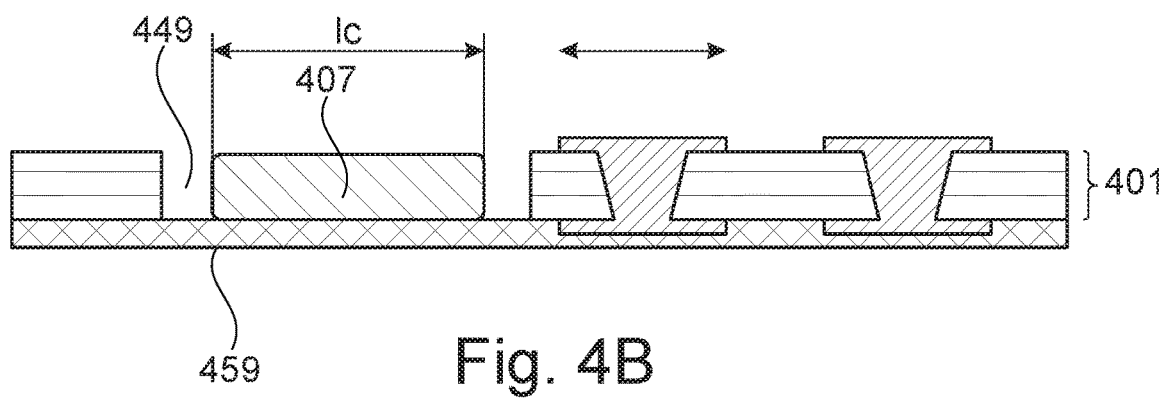
Figure 4C:
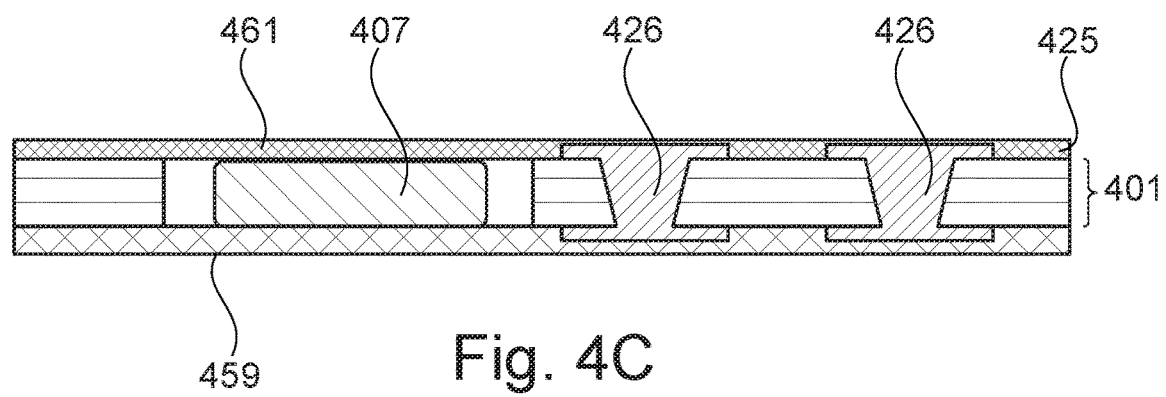

FIGS. 4A, 4B and 4C schematically illustrate method steps how to align a component to be embedded into a component carrier. After manufacturing the first level stack 401 and providing some through hole vias 426, a tape holder 459 is attached to the lower surface 417 of the first level stack 401 which is the surface with which a corresponding surface of the component to be embedded is to be aligned. In the method step as illustrated in FIG. 4B, the component (for example first component 407) is placed on the tape holder which also comprises an adhesive such that the component 407 adheres to the tape holder 159. In the method step as illustrated in FIG. 4C, adhesive or resin sheet 461 is filled within spaces or gaps within the first through hole 449 not occupied by the component 407. The tape holder 459 may later be removed.

Other methodologies to vertically align the component 407 are possible, such as for example laterally fixing the component 407 at an inside border of the first through hole 449, thus at the first level stack 401.

Embodiments of the present invention disclose a concept and method of balancing the structure to reach a low warping embedded PCB packaging solution by defining criteria between the thicknesses of the embedded components compared to the thickness of the fully cured PCB core material. The thickness of the active die or the passive component (such as first component 107 or second component 139) may be no more than 100 µm thinner compared to the fully cured core thickness. More specifically, the thickness of the component may be no more than 50 µm thinner than the fully cured core thickness. Other embodiments enable a design flexibility by the capability of vertically aligning the component on either the top or bottom side of the embedded core during the different steps of embedding. According to an embodiment, a balanced stepwise embedding for creating a low warping module with thin dies and several different component thicknesses is provided.

The invention claimed is:

1. A component carrier, comprising:
   a first level stack comprising at least one of first plural electrically conductive layer structures and first electrically insulating layer structures;
   a first component aligned within a first through hole cut out in the first level stack such that one of an upper or a lower surface of the first component is substantially flush with an respective upper or a lower surface of the first level stack;
   at least one of second electrically conductive layer structures and second electrically insulating layer structures attached onto the upper and the lower surface of the first level stack thereby covering the first component at the upper and the lower surface of the first component and pressed to form a second level stack;
   a second component aligned within a second through hole cut out in the second level stack such that one of upper or a lower surface of the second component is substantially flush with an upper or a lower surface of the second level stack; and
   at least one of third electrically conductive layer structures and third electrically insulating layer structures attached onto the upper and the lower surface of the second level stack thereby covering the second component at the upper and the lower surface of the second component and pressed to form a third level stack,
   wherein the upper surface and the lower surface of the first component and the upper surface and the lower surface of the second component are not flush,
   wherein a thickness of the first component is between a thickness of the first level stack diminished by 100 µm and the thickness of the first level stack diminished by 5 µm,
   wherein the thickness of the second component is between 1.5 times and 3 times as great as the thickness of the first component.

2. The component carrier according to claim 1, wherein the lower surface of the first component is substantially positioned flush with the lower surface of the first level stack, wherein the upper surface of the second component is substantially positioned flush with the upper surface of the second level stack.

3. The component carrier according to claim 1, wherein the at least one of the second electrically conductive layer structures and second electrically insulating layer structures comprises at least one first through hole via electrically connected to a terminal of the first component.

4. The component carrier according to claim 1, wherein the at least one of the third electrically conductive layer structures and third electrically insulating layer structures comprises at least one second through hole via electrically connected to a terminal of the second component.

5. The component carrier according to claim 1, wherein the first through hole via contacts a terminal of the first component at the lower surface of the first component,
wherein the second through hole via contacts a terminal of the second component at the upper surface of the second component.

6. The component carrier according to claim 1, wherein the at least one of the third electrically conductive layer structures and third electrically insulating layer structures comprises at least one first extension through hole via electrically connected to the first through hole via in the at least one of the second electrically conductive layer structures and second electrically insulating layer structures.

7. The component carrier according to claim 1, wherein the thickness of at least one of the first component and the second component is between 30 μm and 100 μm.

8. The component carrier according to claim 1, wherein a space within first through hole not occupied by first component is filled by thermosettable material.

9. The component carrier according claim 1, wherein at least one of the first component and the second component and the component carrier is selected from a group consisting of: an electronic component, an electrically non-conductive inlay, an electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter, a receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

10. A method for manufacturing a component carrier, comprising:
cutting out a first through hole in a first level stack comprising at least one of first plural electrically conductive layer structures and first electrically insulating layer structures;
aligning a first component within the first through hole such that one of an upper or a lower surface of the first component is substantially flush with a respective upper or a lower surface of the first level stack;
attaching at least one of second electrically conductive layer structures and second electrically insulating layer structures onto the upper and the lower surface of the first level stack thereby covering the first component at the upper and the lower surface of the first component;
applying at least one of heat and pressure to the at least one of the second electrically conductive layer structures and second electrically insulating layer structures to form a second level stack;
cutting out a second through hole in the second level stack;
aligning a second component within the second through hole such that one of upper or a lower surface of the second component is substantially flush with an upper or a lower surface of the second level stack; and
attaching at least one of third electrically conductive layer structures and third electrically insulating layer structures onto the upper and the lower surface of the second level stack thereby covering the second component at the upper and the lower surface of the second component,
wherein the upper surface and the lower surface of the first component and the upper surface and the lower surface of the second component are not flush,
wherein a thickness of the first component is between a thickness of the first level stack diminished by 100 μm and the thickness of the first level stack diminished by 5 μm,
wherein the thickness of the second component is between 1.5 times and 3 times as great as the thickness of the first component.

11. The method according to claim 10, further comprising:
attaching at least one of third electrically conductive layer structures and third electrically insulating layer structures onto the upper and the lower surface of the second level stack thereby covering the second component at the upper and the lower surface of the second component; and
applying at least one of heat and pressure to the third electrically conductive layer structures and/or electrically insulating layer structures to form a third level stack.

12. The method according to claim 10, wherein the thickness of at least one of the first component and the second component is between 30 μm and 100 μm.

13. The method according to claim 10, wherein aligning the first component comprises:
applying a first auxiliary adhesive layer at a surface of the first level stack such as to cover the first through hole from one side;
adhering the first component at the first auxiliary adhesive layer.

14. The method according to claim 10, wherein aligning the first component comprises:
laterally attaching the first component at the first level stack.

15. The method according to claim 10, further comprising:
filling a space within first through hole not occupied by first component by thermosettable material.

16. A component carrier, comprising:
a first level stack comprising at least one of first plural electrically conductive layer structures and first electrically insulating layer structures;
a first component aligned within a first through hole cut out in the first level stack such that one of an upper or a lower surface of the first component is substantially flush with a respective upper or a lower surface of the first level stack;

at least one of second electrically conductive layer structures and second electrically insulating layer structures attached onto the upper and the lower surface of the first level stack thereby covering the first component at the upper and the lower surface of the first component and pressed to form a second level stack; and a second component aligned within a second through hole cut out in the second level stack such that one of upper or a lower surface of the second component is substantially flush with an upper or a lower surface of the second level stack;

wherein a thickness of the first component is between a thickness of the first level stack diminished by 100 μm and the thickness of the first level stack diminished by 5 μm;

wherein the upper surface and the lower surface of the first component and the upper surface and the lower surface of the second component are not flush, wherein the thickness of the second component is between 1.5 times and 3 times as great as the thickness of the first component.

\* \* \* \* \*